(12) United States Patent
Sun et al.

(10) Patent No.: US 10,714,030 B2
(45) Date of Patent: Jul. 14, 2020

(54) DISPLAY DEVICE AND APPARATUS, DISPLAY CONTROL METHOD AND STORAGE MEDIUM

(71) Applicant: BOE Technology Group Co., Ltd., Beijing (CN)

(72) Inventors: Haiyan Sun, Beijing (CN); Hao Miao, Beijing (CN); Rui Li, Beijing (CN); Hong Zhu, Beijing (CN); Pengju Zhang, Beijing (CN); Mingxing Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 65 days.

(21) Appl. No.: 15/988,075

(22) Filed: May 24, 2018

(65) Prior Publication Data
US 2019/0206309 A1    Jul. 4, 2019

(30) Foreign Application Priority Data
Jan. 3, 2018  (CN) .......................... 2018 1 0004168

(51) Int. Cl.
*G09G 3/34*    (2006.01)
*H01L 27/32*   (2006.01)

(52) U.S. Cl.
CPC ....... *G09G 3/3433* (2013.01); *H01L 27/3232* (2013.01); *H01L 27/3267* (2013.01);
(Continued)

(58) Field of Classification Search
CPC .......... G09G 3/3433; G09G 2300/023; G09G 2300/026; H01L 27/3267; H01L 27/3232; H01L 2251/5323; H01L 2251/5307
See application file for complete search history.

(56) References Cited

U.S. PATENT DOCUMENTS

2002/0145687 A1* 10/2002 Mitsui ............... G02F 1/133603
                                                     349/113
2009/0231662 A1   9/2009 Sorensson et al.
(Continued)

FOREIGN PATENT DOCUMENTS

CN    1470045 A    1/2004
CN    101960373 A  1/2011
(Continued)

OTHER PUBLICATIONS

First office action of Chinese application No. 201810004168.8 dated Jan. 6, 2020.

*Primary Examiner* — Liliana Cerullo
(74) *Attorney, Agent, or Firm* — Fay Sharpe LLP

(57) ABSTRACT

A display device and apparatus, display control method and storage medium are provided. The display device includes first substrate, first dimming layer, a light-emitting layer, second dimming layer and second substrate which are laminated in sequence; the first dimming layer controls the light emitted from the light-emitting layer and incident onto the first dimming layer to present one of the following two states: reflected but not transmitted into the first dimming layer, and transmitted and emergent from one side where the first substrate lies; the second dimming layer controls the light emitted from the light-emitting layer and incident onto the second dimming layer to present one of the following two states: reflected but not transmitted into the second dimming layer; and transmitted and emergent from one side where the second substrate lies. The case that the double-faced images displayed by the display apparatus are mirror images may be avoided.

15 Claims, 5 Drawing Sheets

(52) U.S. Cl.
CPC . *G09G 2300/023* (2013.01); *G09G 2300/026* (2013.01); *H01L 2251/5307* (2013.01); *H01L 2251/5323* (2013.01)

(56) References Cited

U.S. PATENT DOCUMENTS

| | | | |
|---|---|---|---|
| 2010/0277439 A1* | 11/2010 | Charlier | G06F 1/1616 |
| | | | 345/176 |
| 2014/0286047 A1* | 9/2014 | Bohn | G02F 1/133615 |
| | | | 362/607 |
| 2015/0255519 A1 | 9/2015 | Lee et al. | |
| 2016/0005353 A1* | 1/2016 | Bennett | G09G 3/3208 |
| | | | 345/206 |
| 2016/0042702 A1* | 2/2016 | Hirakata | H01L 27/3269 |
| | | | 345/205 |
| 2017/0256679 A1* | 9/2017 | Fan | G09G 5/02 |

FOREIGN PATENT DOCUMENTS

| | | |
|---|---|---|
| KR | 101759423 B1 | 7/2017 |
| WO | WO02071131 A2 | 9/2002 |
| WO | WO2010126756 A2 | 11/2010 |

\* cited by examiner

DISPLAY DEVICE AND APPARATUS, DISPLAY CONTROL METHOD AND STORAGE MEDIUM

CROSS-REFERENCE TO RELATED APPLICATION

The present application claims priority to Chinese Patent Application No. 201810004168.8 filed with the State Intellectual Property Office of the P.R.C. on Jan. 3, 2018 and titled "DISPLAY DEVICE AND APPARATUS, AND DISPLAY CONTROL METHOD, which is incorporated herein by reference in its entirety.

TECHNICAL FIELD

The present disclosure relates to photoelectric technology and display device manufacture, and particularly to a display device and apparatus, display control methods and storage mediums.

BACKGROUND

Along with the development of display technology, people usually need a double-faced display device that can display images on both sides of a display. Such double-faced display device can be applied to communications industry, government windows, financial industry, transportation industry and the service halls of various service trades, such as various public occasions with large human traffic, for example, airports, train stations, subway stations, and dining halls. Therefore, the double-faced display device has a broad application prospect.

At present, a common organic light emitting diode (OLED) double-faced display adopts thinner metal electrodes and a semitransparent material to realize the simultaneous display of a front face and a back face of the double-faced display device together. However, a case that the images displayed on the front face and the back face are mirror images often occurs to the double-faced display device, thereby affecting the use effect of a user and affecting the double-faced display effect and the viewing effect of the user. Of course, there exist other implementing methods for the double-faced display of the double-faced display device, for example, two top emitting OLED device are attached to realize the double-faced display effect of the display device. Although the normal display of the front and back faces of the double-faced display device can be realized by attaching the two top emitting OLED devices, such an implementing mode also has defects, that is, the two top emitting OLED devices are higher in manufacturing cost, are not suitable for popularization and application and not suitable for the subsequent maintenance of the user either.

SUMMARY

The present disclosure provides a display device and apparatus, display control methods and storage mediums, which may at least overcome any of the above technical defects, and particularly may solve the case that the images displayed on the front face and the back face are mirror images often occurs to the double-faced display device and the problem of the high cost when the double-faced display device display normally. The technical solutions in the present disclosure are as follows.

In a first aspect, there is provided a display device. The display device comprises a first substrate, a first dimming layer, a light-emitting layer, a second dimming layer and a second substrate which are laminated in sequence; wherein the first dimming layer is configured to control the light emitted from the light-emitting layer and incident onto the first dimming layer to present one of the following two states: being reflected but not transmitted into the first dimming layer; and being transmitted and emergent from one side where the first substrate lies; the second dimming layer is configured to control the light emitted from the light-emitting layer and incident onto the second dimming layer to present one of the following two states: being reflected but not transmitted into the second dimming layer; and being transmitted and emergent from one side where the second substrate lies.

In some embodiments, the first dimming layer and the second dimming layer each comprises a dimming medium for adjusting a light emergent direction.

In some embodiments, the dimming medium comprises an electric deflection material, one side of the light-emitting layer close to the first dimming layer and the other side of the light-emitting layer close to the second dimming layer each is provided with a common electrode, one side of the first substrate close to the first dimming layer is provided with at least one pair of bottom electrodes, and one side of the second substrate close to the second dimming layer is provided with at least one pair of the bottom electrodes.

In some embodiments, the electric deflection material comprises graphene oxide.

In some embodiments, a thickness range of the graphene oxide is 1.5 micrometer to 5.5 micrometers.

In some embodiments, the common electrode is made of a transparent conductive material, and the bottom electrode is made of a transparent or semitransparent alloy material.

In some embodiments, the common electrode and the bottom electrode are made of ITO respectively. Alternatively, the common electrode is made of ITO, and the bottom electrode is made of Mg—Ag alloy.

In some embodiments, the display device is an OLED display device.

In some embodiments, the light-emitting layer comprises a pixel unit which comprises at least one sub-pixel unit, each sub-pixel unit corresponds to the bottom electrode respectively, and the bottom electrodes corresponding to adjacent two sub-pixel units are separated by an insulating support structure.

In some embodiments, when the pixel unit comprises one sub-pixel unit, the sub-pixel unit is a red sub-pixel unit, a green sub-pixel unit, a blue sub-pixel unit or a transparent sub-pixel unit.

In some embodiments, the pixel unit comprises a red sub-pixel unit, a green sub-pixel unit and a blue sub-pixel unit which are arranged in sequence.

In a second aspect, there is provided a display apparatus. The display apparatus comprises a plurality of display devices arranged in a matrix in the first aspect.

In a third aspect, there is provided a display control method applied to a display apparatus comprising a plurality of display devices arranged in a matrix, wherein, the display device comprises a first substrate, a first dimming layer, a light-emitting layer, a second dimming layer and a second substrate which are laminated in sequence; the first dimming layer is configured to control the light incident onto the first dimming layer to present one of the following two states: being reflected but not transmitted into the first dimming layer; and being transmitted and emergent from one side where the first substrate lies; the second dimming layer is configured to control the light incident onto the second dimming layer to present one of the following two states: being reflected but not transmitted into the second dimming layer; and being transmitted and emergent from one side where the second substrate lies, the first dimming layer of each of the display devices is located on the same side of the display apparatus, and the display control method comprises: applying the same signal to the light-emitting layers of two display devices which are associated in accordance with a preset rule for each row; and controlling the first dimming layer of one of the two associated display devices to be in a reflective state and the second dimming layer thereof to be in a transmission state, and controlling the first dimming layer of the other one of the two associated display devices to be in a transmission state and the second dimming layer thereof to be in a reflective state.

In some embodiments, the two display devices associated in accordance with the preset rule are the $i^{th}$ display device counted from one side of each row and the $(i+j)^{th}$ display device counted from the side of the same row; and in the two associated display devices, one display device is the $i^{th}$ display device, the other display device is the $(i+j)^{th}$ display device, i is a positive integer and j is a positive integer.

In some embodiments, each row where the plurality of display devices are arranged in a matrix comprises a first end and a second end opposite to the first end, and the two display devices associated in accordance with the preset rule are the $n^{th}$ display device counted from the first end of each row and the $n^{th}$ display device counted from the second end of the same row; and in the two associated display devices, one display device is the nth display device counted from the first end, the other display device is the $n^{th}$ display device counted from the second end, and n is a positive integer.

In a fourth aspect, there is provided display control method applied to a display apparatus comprising a plurality of display devices arranged in a matrix, wherein, the display device comprises a first substrate, a first dimming layer, a light-emitting layer, a second dimming layer and a second substrate which are laminated in sequence; the first dimming layer is configured to control the light incident onto the first dimming layer to present one of the following two states: being reflected but not transmitted into the first dimming layer; and being transmitted and emergent from one side where the first substrate lies; the second dimming layer is configured to control the light incident onto the second dimming layer to present one of the following two states: being reflected but not transmitted into the second dimming layer; and being transmitted and emergent from one side where the second substrate lies, the first dimming layer of each of the display devices is located on the same side of the display apparatus, and the display control method comprises: controlling the first dimming layer of each of the display devices in each row to be in a reflective state, and controlling the second dimming layer of each of the display devices in each row to be in a transmission state, to realize single-face display.

In some embodiments, the display control method is electrically controlled.

In a fifth aspect, there is provided a storage medium. The storage medium is a nonvolatile computer-readable storage medium, and when an instruction in the storage medium is executed by a processing component of the display apparatus, the display apparatus is capable of executing the display control method in the third aspect.

In a sixth aspect, there is provided a storage medium. The storage medium is a nonvolatile computer-readable storage medium, and when an instruction in the storage medium is executed by a processing component of the display apparatus, the display apparatus is capable of executing the display control method in the fourth aspect.

1. The present disclosure provides a display device and apparatus, display control methods and storage mediums. The display device comprises: a first substrate, a first dimming layer, a light-emitting layer, a second dimming layer and a second substrate which are laminated in sequence. The first dimming layer and the second dimming layer are added between the light-emitting layer and the substrates at two sides. The first dimming layer and the second dimming layer are configured to adjust the light emergent direction, such that light emitted from the light-emitting layer, after being incident on the dimming layer, may be reflected from the first dimming layer and/or the second dimming layer to the light-emitting layer, or may transmit through the first dimming layer to the first substrate and then be emitted from one side of the first substrate, and transmit through the second dimming layer to the first second and then be emitted from one side of the second substrate such that the light may be transmitted or reflected on the first dimming layer and/or the second dimming layer. In this way, when light transmits through both the first dimming layer and the second dimming layer, light is emitted from one side of the first substrate and one side of the second substrate. That is, the control function of the first dimming layer and the second dimming layer is represented as following: light emitted from the light-emitting layer is reflected by the first dimming layer and transmits through the second dimming layer and is emitted from the second substrate, such that a side where the first dimming layer is does not display images and a side where the second dimming layer is displays images. Alternatively, light emitted from the light-emitting layer is reflected by the second dimming layer and transmits through first second dimming layer and is emitted from the first substrate, such that a side where the second dimming layer is does not display images and a side where the first dimming layer is displays images. In this way, the display apparatus comprising a plurality display devices may realize a double-faced display.

2. The present disclosure provides a display device and apparatus, display control methods and storage mediums. Each of the first and the second dimming layers is enabled to be in a reflective state or in a transmission state through the dimming medium, realizing that light may be reflected or transmitted in the first dimming layer and be reflected or transmitted in the second dimming layer. The dimming medium is flaky. The dimming medium does not transmit light, but reflects light. The dimming medium may be made of two-dimensional flaky graphene oxide. Since the graphene oxide comprises a lot of oxygen-containing functional groups, the carbon layer bears negative charges and the thickness range of the graphene oxide may be 2 um to 5 um. After the graphene oxide is processed, under the action of electric field, the flaky single layer of graphene oxide is parallel with the electric field, thereby changing the emitting direction and emitting angle of light. In addition, as the raw material of the graphene oxide is cheap and is easy to obtain, it helps manufacture the dimming medium and lowering the manufacturing cost.

3. The present disclosure provides a display device and apparatus, display control methods and storage mediums. One side of the light-emitting layer close to the first dimming layer and the other side of the light-emitting layer close to the second dimming layer each is provided with a common electrode, one side of the first substrate close to the first dimming layer, and one side of the second substrate close to the second dimming layer each is provided with a bottom electrode. When a potential difference exists in the dimming medium in the dimming layer, a side of the dimming medium with a bigger area is parallel with the electric field generated by the potential difference. The procedure includes: when the bottom electrodes receives the same voltage and different voltages are applied to the bottom electrodes and the common electrodes, there is a potential difference between the bottom electrode and the common electrode, and further an electric field vertical to the light-emitting layer, the first substrate and the second substrate is generated between the bottom electrode and the common electrode. Here, the dimming medium is parallel with the electric field, such that light emitted from the light-emitting layer may be transmitted through the dimming layer. When this method is applied to a display apparatus, the display apparatus displays images. When the bottom electrodes receives different voltages, there is a potential difference between the bottom electrodes, and further an electric field parallel with the light-emitting layer, the first substrate and the second substrate is generated. Here, the dimming medium is parallel with the electric field, such that light emitted from the light-emitting layer may not be reflected by the dimming layer. When this method is applied to a display apparatus, the display apparatus may not display images.

4. The present disclosure provides a display device and apparatus, display control methods and storage mediums. When the light-emitting layer comprises a plurality of sub-pixel units, each of the sub-pixel units is provided with a bottom electrode, and bottom electrodes corresponding to every two adjacent sub-pixel units may be separated by an insulating support structure, such that an electric field may be generated between the electrode in the first dimming layer and the electrode in the second dimming layer corresponding to each sub-pixel unit, and the electric fields will not intervene with each other. Thus, light emitted from each sub-pixel unit may be reflected and transmitted in the first dimming layer and in the second dimming layer. In this way, when the display control method is adopted to apply voltages to the bottom electrodes, the first dimming layer and the second dimming layer corresponding to the sub-pixel units may be in a reflective state and in a transmission state, respectively. When this method is applied to a display apparatus, by controlling the first dimming layer and the second dimming layer in the display device to be in different state, a double-faced display of the display apparatus comprising a plurality display devices may be achieved.

5. The present disclosure provides a display device and apparatus, display control methods and storage mediums. There are a plurality display devices in the display apparatus. The dimming layers at the same side of the display apparatus are all first dimming layers, or the dimming layers at the same side of the display apparatus are all second dimming layers. When the dimming layers at one side of the display apparatus are all in a reflective state, and the dimming layers at the other side of the display apparatus are all in a transmission state, single-face display may be achieved, thereby achieving switch between the double-faced display and the single-face display.

Additional aspects and advantages of the present disclosure will be described below and will become apparent in the following description, or may be learned from the practice of the present disclosure.

BRIEF DESCRIPTION OF THE DRAWINGS

The above aspects and/or additional aspects and advantages of the present disclosure will be described below in a clear and understandable way in combination with the accompanying drawings.

DETAILED DESCRIPTION

The embodiments of the present disclosure are described in detail in the following. The examples of the embodiments are shown in the accompanying drawings. The same or similar elements or the elements having the same or similar functions are represented by the same or similar signs from beginning to end. The following embodiments described with reference to the accompanying drawings are exemplary, and are merely intended to explain the present disclosure rather than limiting the present disclosure.

Those skilled in the art could understand, unless otherwise stated, that the singular form "a", "one", "said" and "such" used here may also include a plural form. It should be further understood that the term "comprise" used in the specification of the present disclosure refers to the characteristic, integer, step, operation, element and/or component rather than excluding existence or addition of one or more other characteristics, integers, steps, operations, elements, component and/or the group thereof.

Those skilled in the art could understand, unless otherwise stated, all terms (including technical terms and scientific terms) used here have the same meaning that is understood by those ordinary skilled in the art. It should be further understood that those terms defined in the universal dictionary should have the same meaning as] that in the context of the prior art, and unless specifically defined like this, the terms are not explained with the ideal or too formal meaning.

Figure 1:
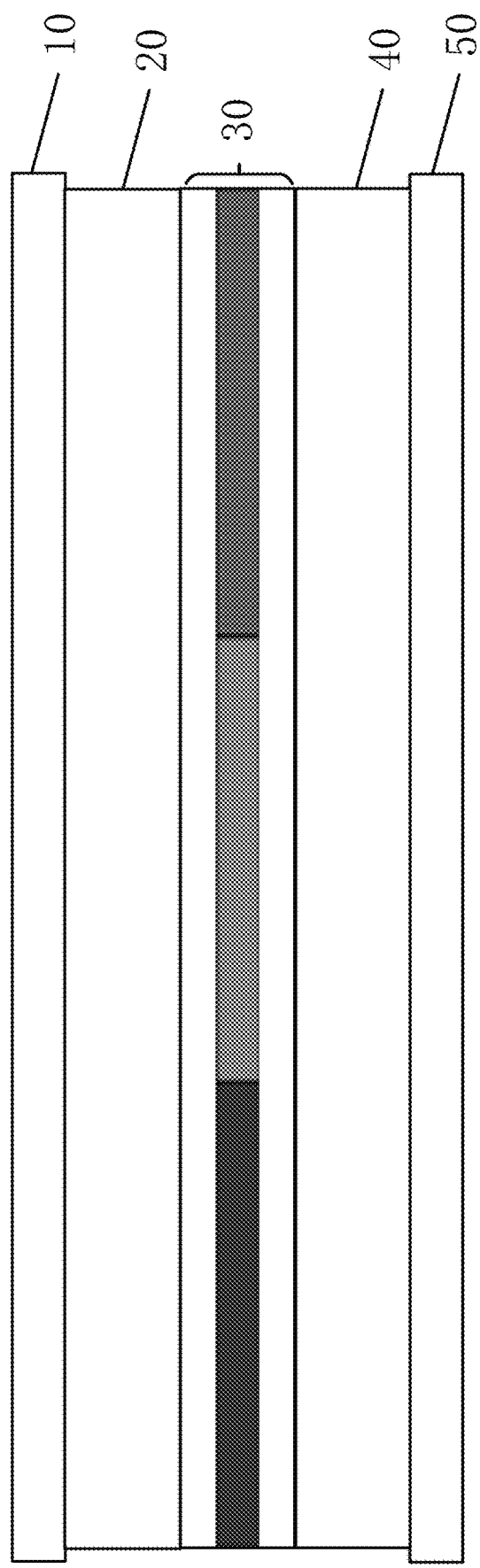
FIG. 1 is a structural diagram of a display device provided in the present disclosure.

The present disclosure provides a display device. As shown in FIG. 1, the display device comprises a first substrate 10, a first dimming layer 20, a light-emitting layer 30, a second dimming layer 40 and a second substrate 50 which are laminated in sequence.

The first dimming layer 20 is configured to control the light incident thereto to be switched between a reflective state and a transmission state, and the second dimming layer

40 is configured to control the light incident thereto to be switched between a reflective state and a transmission state, thereby realizing that when the light emitted from the light-emitting layer 30 is capable of being transmitted through the dimming layer in the transmission state, the side where the dimming layer in the transmission state realizes image display, and when the light emitted from the light-emitting layer 30 is incapable of being transmitted through the dimming layer in the reflective state, the side where the dimming layer in the reflective state performs no image display. In the embodiment of the present disclosure, the first substrate 10 and the second substrate 50 each may be made of a light transmitting glass material or light transmitting plastic material.

The first dimming layer 20 is configured to control the light emitted from the light-emitting layer and incident to the first dimming layer 20 to be reflected without transmitting through the first dimming layer 20, such that the first dimming layer 20 is in the reflective state, or to be transmitted to be emergent from one side where the first substrate 10 lies, such that the first dimming layer 20 is in the transmission state. That is, the first dimming layer 20 is configured to control the light emitted from the light-emitting layer and incident to the first dimming layer 20 to present one of the following two states: the light is reflected but not transmitted through the first dimming layer 20, such that one side where the first dimming layer 20 lies performs no image display; and the light is transmitted and is emergent from one side where the first substrate 10 lies, such that one side where the first dimming layer 20 lies performs image display.

The second dimming layer 40 is configured to control the light emitted from the light-emitting layer and incident to the second dimming layer 40 to be reflected without transmitting through the second dimming layer 40, such that the second dimming layer 40 is in the reflective state, or to be transmitted to be emergent from one side where the second substrate 50 lies, such that the second dimming layer 40 is in the transmission state. That is, the second dimming layer 40 is configured to control the light emitted from the light-emitting layer and incident to the second dimming layer 40 to present one of the following two states: the light is reflected but not transmitted through the second dimming layer 40, such that one side where the second dimming layer 40 lie performs no image display; and the light is transmitted and is emergent from one side where the second substrate 50 lies, such that one side where the second dimming layer 40 lies performs image display.

The light-emitting layer 30 comprises a light emitting device used as a light source. The light emitting device generates light and emits the light toward both sides of the light-emitting layer 30, such that the light emitted by the light emitting device is respectively emitted to the first dimming layer 20 and the second dimming layer 40. The first dimming layer 20 and the second dimming layer 40 are configured to adjust whether the light is transmitted through the first dimming layer 20 and/or the second dimming layer 40. That is, the first dimming layer 20 is configured to adjust whether the light is transmitted through the first dimming layer 20 and the second dimming layer 40 is configured to adjust whether the light is transmitted through the second dimming layer 40.

When a display apparatus comprises a plurality of display devices arranged in a matrix, the first dimming layers 20 of all display devices are all located on one side of the display apparatus, and when the second dimming layers 40 of all display devices are all located on the other side opposite to the one side of the display apparatus, the light-emitting layer 30 receives a signal and emits light, when the first dimming layers 20 of part of the display devices are controlled to be in the transmission state and the second dimming layers 40 of part of the display devices to be in the reflective state, and when the first dimming layers 20 of the other part of the display devices are controlled to be in the reflective state and the second dimming layers 40 of the other part of the display devices to be in the transmission state, the double-face display of the display apparatus comprising a plurality of display device can be realized.

Further, the first dimming layer 20 and the second dimming layer 40 each comprises a dimming medium used for adjusting a light emergent direction. In the embodiment of the present disclosure, a transmitting condition of the light in the first dimming layer 20 and the second dimming layer 40 is mainly adjusted by the dimming mediums, such that after being incident to the first dimming layer 20 and the second dimming layer 40, the light presents the reflective state or the transmission state.

Figure 2:
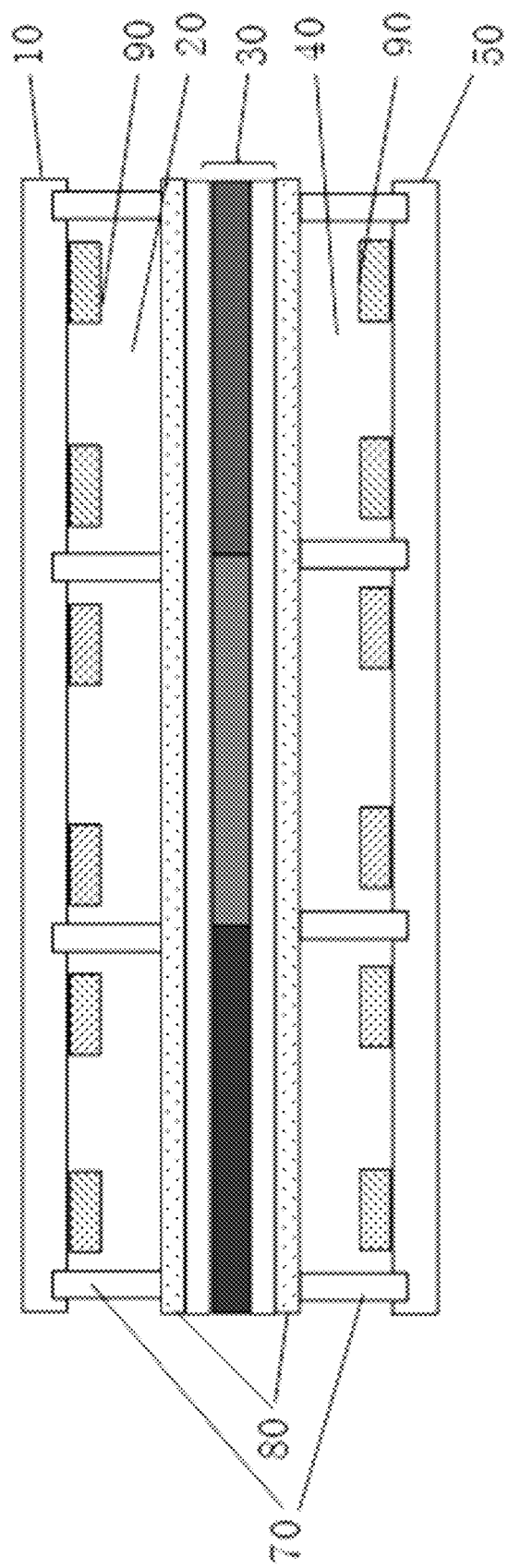
FIG. 2 is a structural diagram of another display device provided in the present disclosure.

Further, as shown in FIG. 2, the dimming medium is an electric deflection material. One side of the light-emitting layer 30 close to the first dimming layer 20 and the other side of the emitting layer 30 close to the second dimming layer 40 each is provided with a common electrode 80. One side of the first substrate 10 close to the first dimming layer 20 is disposed with at least one pair of bottom electrodes 90, and one side of the second substrate 50 close to the second dimming layer 40 is disposed with the at least one pair of bottom electrodes 90.

When the same voltage is applied between the bottom electrodes 90 and different voltages are applied to the bottom electrodes 90 and the common electrodes 80, a potential difference is generated between the bottom electrodes 90 and the common electrodes 80, and further an electric field is generated by the potential difference. Since the dimming medium is the electric deflection material, when the dimming medium has the electric field, according to a distribution rule of the electric field, the electric deflection material is deflected to be consistent with the electric field in direction, and is regularly distributed in the dimming layer where the dimming medium lies. That is, when there is the electric field, the regularly distributed direction of the dimming medium is parallel with the direction of the electric field, such that the light is in the transmission state in the dimming layer where the dimming medium lies. Exemplarily, in order to intuitively and vividly describe the electric field distribution, electric field lines are drawn in FIG. 3, the electric field lines are vertical to the second substrate 50 and the light-emitting layer 30. At this point, the direction of the electric deflection material in the second dimming layer 40 is vertical to the second substrate 50 and the light-emitting layer 30. The electric deflection material is regularly distributed in the second dimming layer 40, such that the light is in the transmission state in the second dimming layer 40.

When different voltages are applied between the bottom electrodes 90, the potential difference is generated between the bottom electrodes 90, and further the electric field is generated by the potential difference. Since the dimming medium is the electric deflection material, when there is an electric field, the dimming medium is regularly distributed in the dimming layer where the dimming medium lies. When there is the electric field, the regularly distributed direction of the dimming medium is parallel with the direction of the electric field, such that the light is in the reflective state in the dimming layer where the dimming medium lies. Exemplarily, in order to intuitively and vividly describe the electric field distribution, electric field lines are drawn in FIG. 4, the electric field lines are parallel with the second substrate 50 and the light-emitting layer 30. At this point, the direction of the electric deflection material in the second dimming layer 40 is parallel with the second substrate 50 and the light-emitting layer 30. The electric deflection material is regularly distributed in the second dimming layer 40, such that the light is in the reflective state in the second dimming layer 40.

Figure 3:
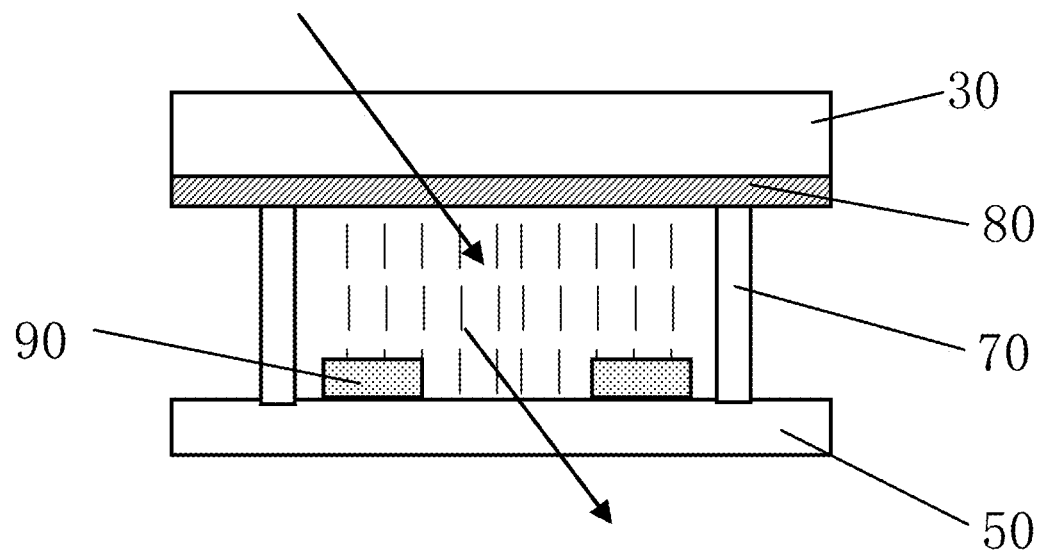
FIG. 3 is an example in which a second dimming layer corresponding to a sub-pixel unit of a display device in FIG. 2 is in a transmission state.
Figure 4:
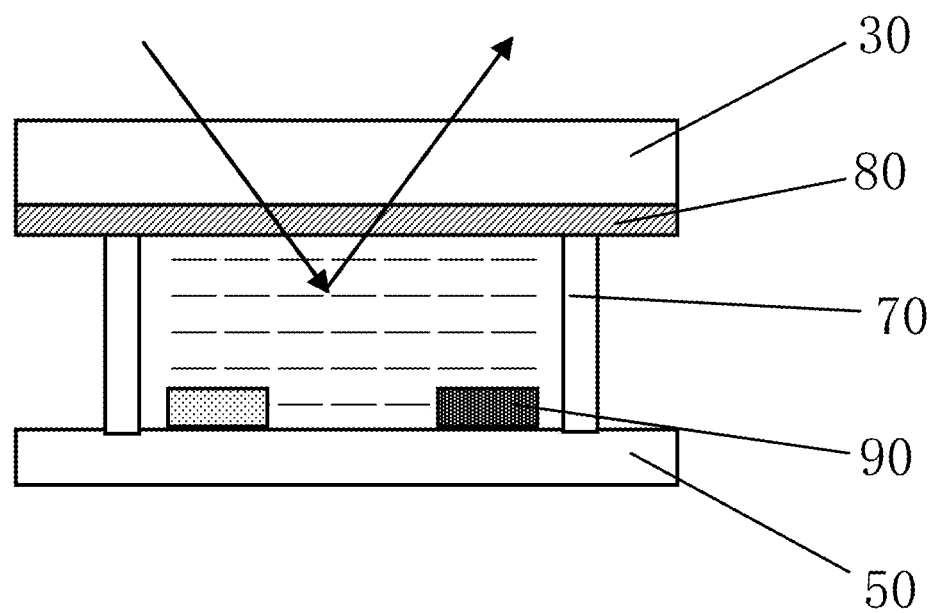
FIG. 4 is an example in which a second dimming layer corresponding to a sub-pixel unit of a display device in FIG. 2 is in a reflective state.

It should be noted that the electric field lines in FIGS. 3 and 4 merely schematically show the distribution direction of the electric field instead of representing the intensity of the electric field. The distribution of the electric field is not defined by the figures. The intensity of the electric field specifically takes the potential difference between the bottom electrodes 90 and the potential difference between the bottom electrodes 90 and the common electrodes 80 as a criterion.

Further, in the embodiment of the present disclosure, the light-emitting layer 30 comprises a cathode, an electron injection layer, an electron transmission layer, a single primary color light-emitting layer (for example, one or more of R, G and B), a hole transmission layer, a hole injection layer, an anode, etc., (not shown) which are sequentially arranged in lamination. In order to ensure that the light-emitting layer 30 can be singly loaded with a light emitting signal, the cathode and the anode of the light-emitting layer 30 are merely configured to realize the light emitting of the light-emitting layer 30 and are located in the light-emitting layer 30. While the bottom electrodes 90 and the common electrodes 80 in the first dimming layer 20 and the second dimming layer 40 in the embodiment of the present disclosure are merely configured to change an electric field direction in the first dimming layer 20 and the second dimming layer 40. That is, the bottom electrodes 90 and the common electrode 80 in the first dimming layer 20 are merely configured to change the electric field direction in the first dimming layer 20 and the bottom electrodes 90 and the common electrode 80 in the second dimming layer 40 are merely configured to change the electric field direction in the second dimming layer 40. Therefore, the cathode and anode in the light-emitting layer 30 and the common electrodes 80 in the first dimming layer 20 and the second dimming layer 40 are not shared. For example, the cathode in the light-emitting layer 30 and the common electrode 80 in the first dimming layer 20 are not shared, and the anode in the light-emitting layer 30 and the common electrode 80 in the second dimming layer 40 are not shared.

Further, when different voltages are applied between the bottom electrodes 90, the voltage of the common electrodes may be zero, to avoid the interference of the voltage of the common electrodes on the distribution direction of the electric field. The electric field is formed when the voltages of the two bottom electrodes are different. In some embodiments, the cathode may be made of a transparent or semi-transparent electrode such as Mg—Al alloy. The electron transmission layer may be made of an organic compound or derivate having higher energy level of an excited state. The single primary color light-emitting layer may be made of an organic small molecular or high molecular material. The hole transmission layer may be made of an organic compound or derivative having higher hole mobility and lower free potential, for example, the hole transmission layer is made of aromatic amine or carbazole and the like. The anode may be made of an indium tin oxide (ITO) transparent electrode, wherein the ITO is an N type semiconductor material and has high conductivity, high visible light transmittance, high mechanical strength and better chemical stability. The Fermi level of the N type semiconductor material is high and can form an energy band to be bent upward in solution, holes are accumulated, and the anode is easy to form.

Further, in the embodiment of the present disclosure, the bottom electrodes 90 and the common electrodes 80 of the first dimming layer 20 and the second dimming layer 40 may be made of the same material and are the same in structural distribution. In order to realize the double-faced display of the display device, in an actual use process, when the light-emitting layer 30 receives a signal, cathode electrons in the light-emitting layer 30 enter the single primary color light emitting layer by the electron injection layer or the electron transmission layer, and anode holes in the light-emitting layer 30 enter the single primary color light emitting layer by the hole transmission layer or the hole injection layer, and the electrons and the holes are combined to form excitons. The excitons are migrated under the action of the electric field and transmit the energy to light emitting molecules. The electrodes are excited to transit to an excited state from a ground state. The energy of the excited state is deactivated by transition. Photons are generated to release optical energy, and further the display device is caused to emit light.

When the first dimming layer 20 of the same display device is in the transmission state, the second dimming layer 40 of the display device is in the reflective state. That is, when the bottom electrodes 90 and the common electrode 80 of the first dimming layer 20 form the electric field, the electric field is formed between the bottom electrodes 90 of the second dimming layer 40, and the common electrode of the second dimming layer 40 is not applied with the voltage, to avoid the generation of the electric field between the common electrode of the second dimming layer 40 and the bottom electrodes of the second dimming layer 40. Further, the interference on the electric field between the two bottom electrodes of the second dimming layer 40 is avoided. Further the interference on the distribution rule of the dimming medium (graphene oxide) in the electric field is avoided.

When the display device is applied in the display apparatus, the same display device can only emit light to one of the two opposite sides of the display apparatus, while one display apparatus comprises a plurality of display devices arranged in a matrix. Part of the display devices in the plurality of display devices are respectively controlled to emit light on one of the two opposite sides of the display apparatus, and the rest part of display devices are controlled to emit light on the other side of the two opposite sides of the display apparatus. In other words, the bottom electrodes 90 in the first dimming layers 20 of part of the display devices are applied with the same voltage, the bottom electrodes 90 and the common electrodes 80 in the first dimming layers 20 are applied with different voltages, and the bottom electrodes 90 in the second dimming layers 40 of such part of display devices are applied with different voltages, such that the first dimming layers 20 are in the transmission state, and the second dimming layers 40 are in the reflective state. The bottom electrodes 90 in the second dimming layers 40 of the rest part of display devices are applied with the same voltage, the bottom electrodes 90 and the common electrodes 80 are applied with different voltages, and the bottom electrodes 90 in the first dimming layers 20 of the rest part of display devices are applied with different voltages, such that the first dimming layers 20 are in the reflective state, and the second dimming layers 40 are in the transmission state, thereby realizing that the light emitted by the light-emitting layers 30 of part of display devices can only be transmitted to one side of the display apparatus, and the light emitted by the light-emitting layers 30 of rest part of display devices can only be transmitted to the other side of the display apparatus. Therefore, the display apparatus can form double-faced display patterns. In some embodiments, the electric deflection material comprises graphene oxide. Wherein a thickness range of the graphene oxide is 1.5 micrometer to 5.5 micrometers.

The graphene oxide is oxide of graphene. Compared with the graphene, the property of the graphene oxide is more active than that of the graphene since the oxygen-containing functional groups of the graphene oxide are increased. The properties of the graphene oxide can be changed by various reactions with the oxygen-containing functional groups. The preparing method for the graphene oxide material comprises a brodie method, a Staudenmaier method and a hummers method, wherein the Hummers method further comprises an improved Hummers method, an over-production auxiliary Hummers method, etc. The suspension liquid of single layer graphene oxide is prepared. The graphene is a material having higher conductivity, while the conductivity of pure graphene oxide is very poor. The introduction of oxygen atoms damages a conjugated structure of the original graphite, such that the peeled graphene oxide loses the conductivity, thereby limiting the application of the graphene oxide in the fields of optics and electrics. Therefore, the graphene oxide needs to be modified, for example, the sp2-keyed joint graphene net structure is recovered by a chemical or electrochemical reduction method, such that deoxygenation is realized to realize re-graphitization. Therefore, the conductivity of the graphene oxide is notably increased and is even equivalent to the original graphite, and further the application field of the graphene oxide is expanded.

Figure 5:
FIG. 5 illustrate a case in which the planar structure of graphene oxide is parallel with the electric field direction when the dimming medium in a display device is made of graphene oxide.

In the embodiment of the present disclosure, the two-dimensional flaky graphene oxide is the dimming medium used by the present disclosure, as shown in FIG. 5. Wherein the optional thickness range of the two-dimensional material layer graphene oxide material is 1.5 micrometer to 5.5 micrometers. Further, the thickness range of the two-dimensional material layer graphene oxide material may be 2 micrometers to 5 micrometers. The structure of the graphene oxide material is as shown in FIG. 5, and presents a flaky two-dimensional structure. The graphene oxide material can be deflected along with the electric field direction, its planar structure is parallel with the electric field direction, and the electric field direction is the direction as shown by an arrow in FIG. 5.

As shown in FIG. 3, when the same voltage is applied between the bottom electrodes 90 and different voltages are applied to the bottom electrodes 90 and the common electrode 80, the potential difference is generated between the bottom electrodes 90 and the common electrodes 80. Further a vertical electric field is formed by the potential difference. In the second dimming layer 40, the planar structure of the graphene oxide is parallel with the electric field direction. The graphene oxide is vertically arranged along the electric field direction, such that the light can penetrate through the second dimming layer 40 and the light is in the transmission state in the second dimming layer 40.

As shown in FIG. 4, when the different voltages are applied between the bottom electrodes 90, the potential difference is generated between the bottom electrodes 90 in the second dimming layer 40. Further a horizontal electric field is formed by the potential difference. The graphene oxide is deflected. In the second dimming layer 40, and the planar structure of the graphene oxide is parallel with the electric field direction. The graphene oxide is horizontally arranged along the electric field direction, such that the light cannot be transmitted through the second dimming layer 40, and the light is in the reflective state in the second dimming layer 40.

In some embodiments, the common electrodes may be made of a transparent conductive material, and the bottom electrodes may be made of a transparent or semitransparent alloy material.

When the first dimming layer 20 and the second dimming layer 40 are in the transmission state, in order to furthest reduce the lost energy caused by transmission of the light through the first dimming layer 20 and the second dimming layer 40 and reduce the change of a light color caused by the energy loss, the common electrode may be made of the transparent conductive material, and the bottom electrodes may also made of the transparent or semitransparent alloy material.

Further, the common electrodes and the bottom electrodes each is made of ITO. Or, the common electrodes are made of the ITO, and the bottom electrodes are made of Mg—Ag alloy.

When the common electrodes and the bottom electrodes are made of the transparent materials, the light emitted by the light-emitting layer 30 is shielded by the common electrodes, to avoid that the luminous flux transmitted through the first substrate 10 or the second substrate 50 after the light is emitted from the light-emitting layer 30 is greatly reduced.

Further, as shown in FIG. 2, the light-emitting layer 30 is a pixel unit. The pixel unit comprises at least one sub-pixel unit. Each sub-pixel unit is correspondingly disposed with a bottom electrode 90. And the bottom electrodes 90 corresponding to adjacent two sub-pixel units are separated by an insulating support structure 70. Specifically, since the light-emitting layer 30 is the pixel unit, according to the needs of image display, the pixel unit of the light-emitting layer 30 may comprise at least one sub-pixel unit. When the pixel unit comprises one sub-pixel unit, the sub-pixel unit may be a red sub-pixel unit R, a green sub-pixel unit G, a blue sub-pixel unit B or a transparent pixel unit. When the pixel unit of the light-emitting layer 30 comprises the sub-pixel units of three primary colors, the light-emitting layer 30 may be the red sub-pixel unit R, the green sub-pixel unit G and the blue sub-pixel unit B which are arranged in sequence. Of course, the light-emitting layer 30 may be formed by combining and arranging one or more of the red sub-pixel unit R, the green sub-pixel unit G, the blue sub-pixel unit B and the transparent pixel unit. Particularly, when the light-emitting layer 30 comprises a plurality of sub-pixel units, the positions of the first substrate 10 and the second substrate 50 corresponding to all sub-pixel units each is provided with a bottom electrode 90. In the display process, in order to avoid the interference among the electric fields of respective sub-pixel units corresponding to the first dimming layer 20, the bottom electrodes 90 corresponding to every two sub-pixel units may be separated by the insulating support structure 70, and the support structure 70 is configured to support the first substrate 10 and the light-emitting layer 30. Correspondingly, in order to avoid the interference among the electric fields of the respective sub-pixel units corresponding to the second dimming layer 40, the bottom electrodes 90 corresponding to every two sub-pixel units may be separated by the insulating support structure 70, and the support structure 70 may support the second substrate 50 and the light-emitting layer 30. Further, when the electric fields corresponding to respective sub-pixel units in the first dimming layer 20 and/or the second dimming layer 40 are changed (the electric field direction is parallel with the first substrate 10 and/or the second substrate 20, or the electric field direction is vertical to the first substrate 10 and/or the second substrate 20), the light emitted to the first dimming layer 20 and/or the second dimming layer 40 from the respective sub-pixel units can be in the reflective state or the transmission state. That is, when the electric field direction corresponding to respective sub-pixel units in the first dimming layer 20 is parallel with the first substrate 10, the light emitted to the first dimming layer 20 from the respective sub-pixel units is in the reflective state. When the electric field direction corresponding to respective sub-pixel units in the first dimming layer 20 is vertical to the first substrate 10, the light emitted to the first dimming layer 20 from the respective sub-pixel units is in the transmission state. When the electric field direction corresponding to respective sub-pixel units in the second dimming layer 40 is parallel to the second substrate 20, the light emitted to the second dimming layer 40 from the respective sub-pixel units is in the reflective state. When the electric field direction corresponding to respective sub-pixel units in the second dimming layer 40 is vertical to the second substrate 20, the light emitted to the second dimming layer 40 from the respective sub-pixel units is in the transmission state.

The display device provided by the embodiment of the present disclosure may be any part having a display function, such as an OLED panel, an active-matrix organic light emitting diode (AMOLED) panel, a mobile phone, a tablet computer, a television, a display, a laptop, a digital photo frame and a navigator.

In order that the display device in the embodiment of the present disclosure can be applied to the double-faced display, the embodiment of the present disclosure also provides a display apparatus. The display apparatus comprises a plurality of display devices in the embodiment of the present disclosure. The plurality of display devices is arranged in a matrix form, to be conveniently combined with a display control method to realize the single-face display or double-faced display of the display apparatus.

The display apparatus provided by the embodiment of the present disclosure may be any product having a display function, such as an OLED display apparatus, an active-matrix organic light emitting diode (AMOLED) display apparatus, a mobile phone, a tablet computer, a television, a display, a laptop, a digital photo frame and a navigator.

The embodiment of the present disclosure provides a display control method. The display control method may be applied to the display apparatus provided by the embodiment of the present disclosure. The first dimming layers and the second dimming layers are in the reflective state according to the reflection of light therein. The first dimming layers and the second dimming layers are in the transmission state according to the transmission of light therein. The first dimming layers of the display devices in each row are controlled to be the reflective state or the transmission state corresponding to the display state. The second dimming layers of the display devices in each row are controlled to be the transmission state or the reflective state corresponding to the display state. Wherein the display state comprises single-face display or double-faced display.

In different display states, the states of the first dimming layers 20 in different display devices are not always the same, and the states of the second dimming layers 40 are not always the same. According to different display states, the first dimming layers 20 and the second dimming layers 40 of the display devices are respectively adjusted to be the reflective state or transmission state corresponding to the display state. That is, after the display devices are applied to the display apparatus, according to a required display state, the first dimming layers 20 of the display devices of each row in the display apparatus are controlled to be adjusted to the reflective state or transmission state corresponding to the display state, such that the light incident to the first dimmer layers 20 is reflected or transmitted. The second dimming layers 40 of the display devices of each row are controlled to be adjusted to the reflective state or transmission state corresponding to the display state, such that the light incident to the second dimmer layers 40 is reflected or transmitted.

The embodiment of the present disclosure provides a display control method. The display control method may be applied to the display apparatus provided by the embodiment of the present disclosure, such that the display apparatus realizes double-faced display. The first dimming layers of the display devices in the display apparatus are all located on the same side on the display apparatus. The second dimming layers of the display devices in the display apparatus are all located on the other side on the display apparatus. The display control method comprises steps S110 and S120.

Step S110: the same signal is applied to the light-emitting layers in the two display devices which are associated according to a preset rule in each row.

As mentioned above, the display apparatus comprises a plurality of display devices arranged in a matrix. The light-emitting layer 30 in the display device is a pixel unit. The pixel unit comprises one or more sub-pixel units. During the double-faced display of the display apparatus, in order that the display devices can normally display and the display apparatus do not have the problem of mirror images, the associated two display devices in each row are caused to receive the same signal, such that the light-emitting layers 30 emit the same luminous flux. Further the color corresponding to the signal can be displayed after the light is transmitted through the sub-pixel units. Wherein the associated two display devices are two display devices which can be applied with the same signal according to the preset rule. The preset rule may be set according to the needs of a user, and a setting manner thereof is detailed in the following.

Step S120: the first dimming layer and the second dimming layer of one of two associated display devices are controlled to be in a reflective state and a transmission state respectively, and the first dimming layer and the second dimming layer of the other of two associated display devices are controlled to be in a transmission state and a reflective state respectively.

Figure 6:
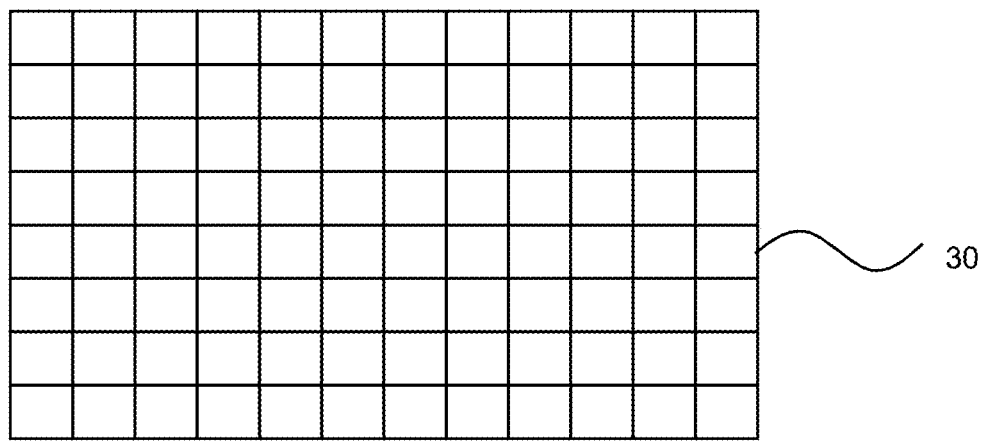
FIG. 6 illustrates a distribution manner of the light-emitting layers of the plurality of display devices in a matrix in the display apparatus provided in the present disclosure.
Figure 7:
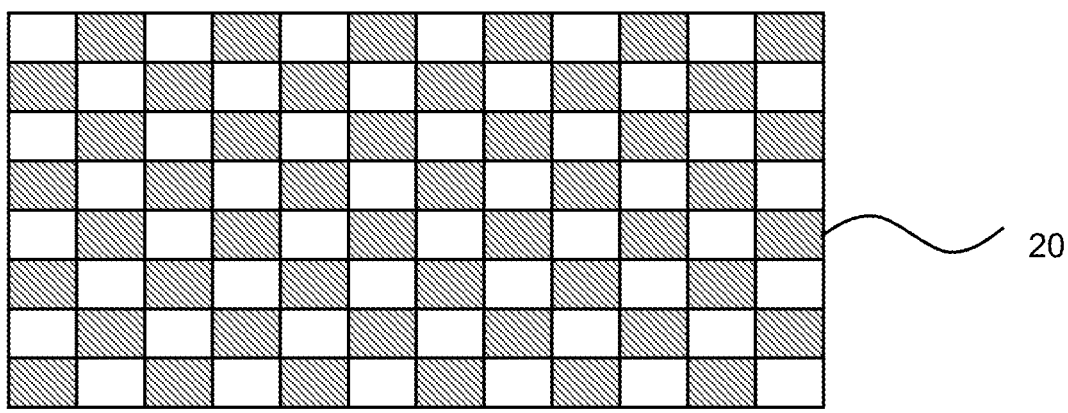
FIG. 7 illustrates a distribution manner when the display apparatus provided in the present disclosure comprises a plurality of display devices in a matrix, the first dimming layers in the plurality of display devices are in a reflective state or a transmission state.
Figure 8:
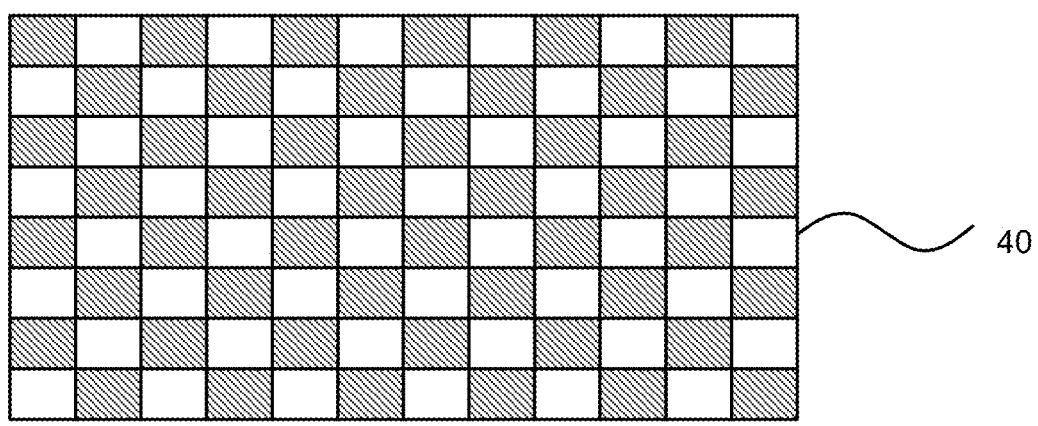
FIG. 8 illustrates a distribution manner when the first dimming layers in a plurality display devices are in a reflective state or a transmission state, the second dimming layers in the plurality display devices are in a reflective state or a transmission state.

When the display apparatus comprises a plurality of display devices arranged in a matrix. For the distribution manner of the light-emitting layers of the plurality of display devices in the display apparatus, refer to FIG. 6. Wherein, each square is used for marking the light-emitting layer 30 of one display device. As shown in FIGS. 7 and 8, the white part represents that the first dimming layers 20 and the second dimming layers 40 are in the transmission state, and the shadow part represents that the first dimming layers 20 and the second dimming layers 40 are in the reflective state. In order to cause the display apparatus to normally realize the double-faced display, the light-emitting layers 30 of the associated two display devices in each row receive the same signal, such that the light-emitting layers 30 can emit the same luminous flux. Further after the light is transmitted through the sub-pixel units, the color corresponding to the signal can be displayed. Since the light-emitting layers 30 emit the light toward the two sides simultaneously, the light emitted by the light-emitting layer 30 of one display device can only be transmitted through one side of such one display device and cannot be transmitted through the other side corresponding to the one side in the display device. Correspondingly, the light emitted from the light-emitting layer 30 of the other display device cannot be transmitted through one side of the other display device, and the one side of the other display device and one side of the one display device are the same side. The light emitted by the light-emitting layer 30 of the other display device can only be transmitted to the other side of the other display device, and the other side of the other display device corresponds to the one side of the other display device. The other side of the other display device and the other side of the one display device are the same side. Wherein FIGS. 6 to 8 merely schematically explain the embodiment of the present disclosure, and the present disclosure is not limited to the embodiment explained in FIGS. 6 to 8.

Figure 9:
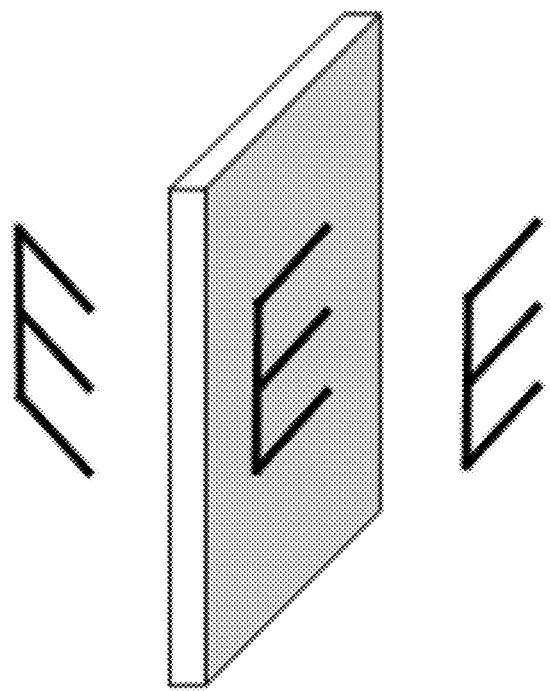
FIG. 9 is an example of a double-faced display for a display apparatus provided in the present disclosure.

Specifically, in order for clearer description, in the display apparatus, the first dimming layers 20 of respective display devices are all located on the same side on the display apparatus, and the second dimming layers 40 of respective display devices are all located on the other side on the display apparatus. That is, if the display apparatus comprises a first side and a second side opposite to the first side, the dimming layers located on the first side of all display devices in the display apparatus are the first dimming layers 20, and correspondingly, the dimming layers located on the second side of all display devices in the display apparatus are the second dimming layers 40. Or the dimming layers located on the first side of all display devices in the display apparatus are the second dimming layers 40, and correspondingly, the dimming layers located on the second side of all display devices in the display apparatus are the first dimming layers 20. When the light-emitting layers 30 of the associated two display devices are applied with the same signal, the associated two display devices comprise one display device and the other display device. In the control process, the first dimming layer 20 of the one display device is controlled to be in the reflective state, and the second dimming layer 40 of the other display device is controlled to be in the reflective state. In addition, the second dimming layer 40 of the one display device is controlled to be in the transmission state, and the first dimming layer 20 of the other display device is controlled to be in the transmission state. By the method, the purpose that the light emitted by the light-emitting layer 30 can be transmitted through one side but cannot be transmitted through the other side of the same display device is realized. In addition, the sides, through which the light is transmitted, of one display device and the other associated display device are opposite, and the sides through which the light is reflected are opposite. Therefore, the display apparatus realizes normal double-faced display in the corresponding position (as shown in FIG. 9), and the case of mirror images does not appear.

When the light-emitting layers 30 of the display devices have a plurality of sub-pixel units, the first dimming layers corresponding to respective sub-pixel units in one display device should be in the same state, the second dimming layers corresponding to respective sub-pixel units in such one display device should be in the same state, and the first dimming layer and the second dimming layer are in different states. That is, the first dimming layers corresponding to respective sub-pixel units in one display device should be in the reflective state or transmission state, and correspondingly, the second dimming layers corresponding to respective sub-pixel units in such one display device should be in the transmission state or reflective state. That is, the first dimming layers corresponding to respective sub-pixel units in one display device should be in the reflective state, and correspondingly, the second dimming layers corresponding to respective sub-pixel units in such one display device should be in the transmission state. Or, the first dimming layers corresponding to respective sub-pixel units in one display device should be in the transmission state, and correspondingly, the second dimming layers corresponding to respective sub-pixel units in such one display device should be in the reflective state. At this point, the amount of the support structures 70 disposed for the respective light-emitting layers can be reduced. That is, only one support structure 70 is arranged between the light-emitting layer 30 close to the edge and the first substrate 10 of the display device respectively, and only one support structure 70 is arranged between the light-emitting layer 30 close to the edge and the second substrate 50 of the display device respectively, thereby further saving the manufacturing economic cost. In addition, since the support structures 70 for supporting respective layers of structures have been respectively disposed in the structures for mounting respective display devices in the display apparatus, and the support structures 70 have an insulating function, the mutual interference among the electric fields in respective display devices can be avoided. Therefore, the support structures 70 may not be disposed in the display devices. Of course, the plurality of support structures 70 may be disposed in the display devices as mentioned above. Besides, the support structures 70 are made of an insulating material, to avoid the interference on the electric fields in the first dimming layers 20 corresponding to respective sub-pixel units. Meanwhile, the interference on the electric fields in the first dimming layers 20 of respective display devices is avoided, the interference on the electric fields in the second dimming layers 40 of respective display devices is avoided, and further the influence on the double-faced display is avoided.

In an implementable manner, the preset interval number of the associated two display devices in the display apparatus is j, and the two display devices associated according to the preset rule are the $i^{th}$ display device from one side of each row and the $(i+j)^{th}$ display device from the side of the same row. Wherein in the associated two display devices, one display device is the $i^{th}$ display device, the other display device is the $(i+j)^{th}$ display device, i is a positive integer and j is a positive integer.

Exemplarily, when i=4 and j=5, in the plurality of display devices arranged in a matrix, the fourth display device from one side of the first row and the ninth display device from the side of the first row are the associated two display devices. When the light-emitting layers 30 of the associated two display devices are applied with a same electric signal, the first dimming layer 20 of the fourth display device is controlled to be in the reflective state, and the second dimming layer 40 of the ninth display device is controlled to be in the reflective state. The second dimming layer 40 of the fourth display device is controlled to be in the transmission state, and the first dimming layer 20 of the ninth display device is controlled to be in the transmission state. Further, in any of two sides of the display apparatus, the light can be transmitted through only one of the associated two display devices. Meanwhile, the light transmitting positions correspond to each other on two sides of the display apparatus, and further double-faced display is realized.

In the same display apparatus, i in each row may be of respective values, while j is a preset fixed value. That is, j of each row is the same, for example, in the first row of the matrix, i=4, and j=5, and in the second row, i=7, and j=5. Wherein i and j are merely schematic numbers, i in each row belongs to {1, 2, 3, 4 . . . }, j in the same display apparatus belongs to {1, 2, 3, 4 . . . }, and the value of j is smaller than the maximal value of i in the same matrix.

In another implementable manner, each row where the plurality of display devices are arranged in a matrix comprises a first end and a second end opposite to the first end, and the two display devices associated according to the preset rule are the $n^{th}$ display device from the first end of each row and the $n^{th}$ display device from the second end of the same row. Wherein in the two associated display devices, one display device is the $n^{th}$ display device from the first end, the other display device is the $n^{th}$ display device from the second end, and n is a positive integer.

Exemplarily, assuming that the initial positions of all rows where the plurality of display devices are arranged in a matrix are the first ends of the display apparatus, and the terminals of all rows are the second ends of the display apparatus. The two associated display devices are the $n^{th}$ display device from the first end of each row and the $n^{th}$ display device from the second end of the same row. When n=6, the first display device in the first row on the first end of the matrix is the first display device, counting from the first display device onto the last display device on the second end, the sixth display device is one of the associated two display devices, and the display device is named as the sixth display device in the first row on the first end. The last display device in the first row on the second end of the matrix serves as the first display device, counting from the last display device as the first display device onto the display device in the initial position on the first end, the sixth display device is the other of the associated two display devices, the display device is named as the sixth display device in the first row on the second end. When the light-emitting layer 30 of the sixth display device in the first row on the first end of the matrix and the light-emitting layer 30 of the sixth display device in the first row on the second end of the matrix are applied with the same electric signal, the first dimming layer 20 of the sixth display device in the first row on the first end is controlled to be in the reflective state, and the second dimming layer 40 of the sixth display device in the first row on the second end is controlled to be in the reflective state; the second dimming layer 40 of the sixth display device in the first row on the first end is controlled to be in the transmission state, and the first dimming layer 20 of the sixth display device in the first row on the second end is controlled to be in the transmission state, thereby realizing the double-faced display. Wherein the first dimming layers 20 of respective display devices are located on the same side on the display apparatus, and the second dimming layers 40 of respective display devices are located on the other side on the display apparatus.

Wherein n in each row may be of respective values. For example, in the first row, n=4, and in the second row, n=7. Wherein n is merely schematic number, n in each row belongs to {1, 2, 3, 4 . . . }. Further, when each row of the matrix comprises m display devices, n is not equal to [(m−1)/2] when m is an odd number.

It should be noted that in the embodiment realizing the double-faced display, in order to avoid the influence on the doubled-faced display effect to ensure a resolution of the display device, in every two adjacent display devices, when the first dimming layer 20 of one display device is in the transmission state and the second dimming layer 40 is in the reflective state, the first dimming layer 20 of the other one display device may be in the reflective state and the second dimming layer 40 may be in the transmission state. Of course, another case is not excluded, that is, when the first dimming layers 20 of any two display devices are both in the transmission state, and the second dimming layers 40 are both in the reflective state, the two display devices should be separated by at least one display device. Besides, for the display device between such two display devices, the first dimming layer 20 is in the reflective state, and the second dimming layer 40 is in the transmission state.

The embodiment of the present disclosure provides a storage medium. The storage medium is a nonvolatile computer-readable storage medium, and when an instruction in the storage medium is executed by the processor of a display apparatus, the display apparatus can execute the display control method provided by the embodiment of the present disclosure to cause the display apparatus to realize double-faced display.

The present disclosure provides a display control method. The display control method may be applied to the display apparatus provided by the embodiment of the present disclosure, such that the display apparatus realizes the single-face display. The display apparatus comprises a plurality of display devices arranged in a matrix. The first dimming layers of the respective display devices are located on the same side on the display apparatus. The second dimming layers of the respective display devices are located on the other side on the display apparatus. The display control method comprises:

Step S140: the first dimming layer of each display device in each row is controlled to be in a reflective state, and the second dimming layer of each display device in each row is controlled to be in a transmission state, to realize single-face display.

In the embodiment of the present disclosure, the first dimming layers 20 of the respective display devices are located on the same side on the display apparatus, and the second dimming layers 40 of the respective display devices are located on the other side on the display apparatus. Exemplarily, the display apparatus comprises a first side and a second side opposite to the first side. The dimming layers located on the first side of all display devices in the display apparatus are the first dimming layers 20, and correspondingly, the dimming layers located on the second side of all display devices in the display apparatus are the second dimming layers 40. Or the dimming layers located on the first side of all display devices in the display apparatus are the second dimming layers 40, and correspondingly, the dimming layers located on the second side of all display devices in the display apparatus are the first dimming layers 20. When the single-face display is realized, only the first dimming layer 20 of each display device in each row needs to be controlled to be in the reflective state, such that the light emitted by the light-emitting layer 30 cannot be transmitted through the first dimming layer 20, and further, one side corresponding to the first dimming layers 30 in the display apparatus does not display the image. The second dimming layer 40 of each display device in each row needs to be controlled to be in the transmission state, such that the light emitted by the light-emitting layer 30 can be transmitted through the second dimming layer 40, and further, one side corresponding to the second dimming layers 40 in the display apparatus displays the image, thereby realizing single-face display.

It should be noted that the first substrate 10, the first dimming layer 20, the second dimming layer 40 and the second substrate 50 in the embodiment of the present disclosure are merely intended for conveniently explaining the present disclosure rather than limiting the names of respective layers of the display device in the implementing process.

In some embodiments, the display control method is electrically controlled.

As mentioned above, the dimming mediums of the first dimming layer 20 and the second dimming layer 40 may be the electric deflection material (for example, graphene oxide). It can be known from the above parsing that the graphene oxide is deflected along with the change of the electric field, such that the larger planar structure of the graphene oxide is parallel with the direction of the electric field. Therefore, when the display device is controlled to display, an electronic control method may be adopted, such that the same voltage is received between the bottom electrodes 90, the bottom electrodes 90 and the common electrodes 80 receive different voltages, and the electric fields are generated between the bottom electrodes 90 and the common electrodes 80. Or, different voltages are received between the bottom electrodes 90, and the electric field is generated between the bottom electrodes 90. Of course, when the dimming medium is not the electric deflection material or not only the electric deflection material, other methods may also be adopted to realize the switching of the state of the first dimming layer 20 between the reflective state and the transmission state, and the switching of the second dimming layer 40 between the transmission state and the reflective state.

The embodiments of the present disclosure further provide a storage medium. The storage medium is a nonvolatile computer-readable storage medium, and when an instruction in the storage medium is executed by a processing component of the display apparatus, the display apparatus is capable of executing the display control method provided in the present disclosure.

It should be noted that the above processing component may be a processor or a processing chip.

The foregoing are only some embodiments of the present disclosure. It should be noted that persons of ordinary skill in the art may make some improvements and modifications without departing from the principle of the present disclosure, and these improvements and modifications shall fall within the scope of protection of the present disclosure.

What is claimed is:

1. A display device, comprising a first substrate, a first dimming layer, a light-emitting layer, a second dimming layer and a second substrate which are laminated in sequence; wherein,
the first dimming layer is configured to control the light emitted from the light-emitting layer and incident onto the first dimming layer to present one of the following two states:
being reflected but not transmitted into the first dimming layer; and
being transmitted and emergent from one side where the first substrate lies;
the second dimming layer is configured to control the light emitted from the light-emitting layer and incident onto the second dimming layer to present one of the following two states:
being reflected but not transmitted into the second dimming layer; and
being transmitted and emergent from one side where the second substrate lies;
wherein the first dimming layer and the second dimming layer each comprises a dimming medium for adjusting a light emergent direction;
the dimming medium comprises an electric deflection material, one side of the light-emitting layer close to the first dimming layer and the other side of the light-emitting layer close to the second dimming layer each is provided with a common electrode, one side of the first substrate close to the first dimming layer is provided with at least one pair of bottom electrodes, and one side of the second substrate close to the second dimming layer is provided with at least one pair of the bottom electrodes; and
the electric deflection material comprises graphene oxide.

2. The display device according to claim 1, wherein the light-emitting layer comprises a pixel unit which comprises at least one sub-pixel unit, each sub-pixel unit corresponds to the one of the pair of bottom electrodes respectively, and the bottom electrodes corresponding to adjacent two sub-pixel units are separated by an insulating support structure.

3. The display device according to claim 2, wherein in case that the pixel unit comprises one sub-pixel unit, the sub-pixel unit is a red sub-pixel unit, a green sub-pixel unit, a blue sub-pixel unit or a transparent sub-pixel unit.

4. The display device according to claim 2, wherein the pixel unit comprises a red sub-pixel unit, a green sub-pixel unit and a blue sub-pixel unit which are arranged in sequence.

5. The display device according to claim 1, wherein the common electrode is made of a transparent conductive material, and the at least one pair of bottom electrodes are made of a transparent or semitransparent alloy material.

6. The display device according to claim 1, wherein the common electrode and the at least one pair of bottom electrodes are made of ITO (Indium Tin Oxide) respectively.

7. The display device according to claim 1, wherein a thickness range of the graphene oxide is 1.5 micrometer to 5.5 micrometers.

8. The display device according to claim 1, wherein the display device is an OLED (organic light emitting diode) display device.

9. A display apparatus, wherein the display apparatus comprises a plurality of display devices according to claim 1 arranged in a matrix.

10. A display control method for a display device, the display device comprising a first substrate, a first dimming layer, a light-emitting layer, a second dimming layer and a second substrate which are laminated in sequence; wherein, the first dimming layer is configured to control the light emitted from the light-emitting layer and incident onto the first dimming layer to present one of the following two states: being reflected but not transmitted into the first dimming layer; and being transmitted and emergent from one side where the first substrate lies; the second dimming layer is configured to control the light emitted from the light-emitting layer and incident onto the second dimming layer to present one of the following two states: being reflected but not transmitted into the second dimming layer; and being transmitted and emergent from one side where the second substrate lies; wherein the first dimming layer and the second dimming layer each comprises a dimming medium for adjusting a light emergent direction; the dimming medium comprises an electric deflection material, one side of the light-emitting layer close to the first dimming layer and the other side of the light-emitting layer close to the second dimming layer each is provided with a common electrode, one side of the first substrate close to the first dimming layer is provided with at least one pair of bottom electrodes, and one side of the second substrate close to the second dimming layer is provided with at least one pair of the bottom electrodes; and the electric deflection material comprises graphene oxide, and the display control method comprising:

applying the same signal to the light-emitting layers of two display devices which are associated in accordance with a preset rule for each row; and controlling the first dimming layer of one of the two associated display devices to be in a reflective state and the second dimming layer thereof to be in a transmission state, and controlling the first dimming layer of the other one of the two associated display devices to be in a transmission state and the second dimming layer thereof to be in a reflective state.

11. The display control method according to claim 10, wherein the two display devices associated in accordance with the preset rule are the $i^{th}$ display device counted from one side of each row and the $(i+j)^{th}$ display device counted from the side of the same row; and in the two associated display devices, one display device is the $i^{th}$ display device, the other display device is the $(i+j)^{th}$ display device, i is a positive integer and j is a positive integer.

12. The display control method according to claim 10, wherein each row where the plurality of display devices are arranged in a matrix comprises a first end and a second end opposite to the first end, and the two display devices associated in accordance with the preset rule are the $n^{th}$ display device counted from the first end of each row and the $n^{th}$ display device counted from the second end of the same row; and in the two associated display devices, one display device is the nth display device counted from the first end, the other display device is the $n^{th}$ display device counted from the second end, and n is a positive integer.

13. A storage medium, wherein the storage medium is a nonvolatile computer-readable storage medium, and when an instruction in the storage medium is executed by a processing component of the display apparatus, the display apparatus is capable of executing the display control method according to claim 10.

14. A display control method for a display device, the display device comprising a first substrate, a first dimming layer, a light-emitting layer, a second dimming layer and a second substrate which are laminated in sequence; wherein, the first dimming layer is configured to control the light emitted from the light-emitting layer and incident onto the first dimming layer to present one of the following two states: being reflected but not transmitted into the first dimming layer; and being transmitted and emergent from one side where the first substrate lies; the second dimming layer is configured to control the light emitted from the light-emitting layer and incident onto the second dimming layer to present one of the following two states: being reflected but not transmitted into the second dimming layer; and being transmitted and emergent from one side where the second substrate lies; wherein the first dimming layer and the second dimming layer each comprises a dimming medium for adjusting a light emergent direction; the dimming medium comprises an electric deflection material, one side of the light-emitting layer close to the first dimming layer and the other side of the light-emitting layer close to the second dimming layer each is provided with a common electrode, one side of the first substrate close to the first dimming layer is provided with at least one pair of bottom electrodes, and one side of the second substrate close to the second dimming layer is provided with at least one pair of the bottom electrodes; and the electric deflection material comprises graphene oxide, and the display control method comprises:

controlling the first dimming layer of each of the display devices in each row to be in a reflective state, and controlling the second dimming layer of each of the display devices in each row to be in a transmission state, to realize single-face display.

15. A storage medium, wherein the storage medium is a nonvolatile computer-readable storage medium, and when an instruction in the storage medium is executed by a processing component of the display apparatus, the display apparatus is capable of executing the display control method according to claim 14.

\* \* \* \* \*